(12) United States Patent
Takeshita

(10) Patent No.: US 7,638,258 B2
(45) Date of Patent: Dec. 29, 2009

(54) POSITIVE RESIST COMPOSITION AND METHOD FOR RESIST PATTERN FORMATION

(75) Inventor: Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 377 days.

(21) Appl. No.: 11/814,916

(22) PCT Filed: Jan. 25, 2006

(86) PCT No.: PCT/JP2006/301127

§ 371 (c)(1),
(2), (4) Date: Jul. 26, 2007

(87) PCT Pub. No.: WO2006/082740

PCT Pub. Date: Aug. 10, 2006

(65) Prior Publication Data

US 2009/0042129 A1    Feb. 12, 2009

(30) Foreign Application Priority Data

Feb. 1, 2005    (JP) .............................. 2005-024869

(51) Int. Cl.
G03F 7/004    (2006.01)
G03F 7/30    (2006.01)

(52) U.S. Cl. ..................... 430/270.1; 430/326; 430/910

(58) Field of Classification Search .............. 430/270.1, 430/326, 910

See application file for complete search history.

(56) References Cited

U.S. PATENT DOCUMENTS

| 6,579,659 B2 * | 6/2003 | Uetani et al. ............. 430/270.1 |
| 7,074,543 B2 * | 7/2006 | Iwai et al. ................ 430/270.1 |
| 2004/0058269 A1 | 3/2004 | Hada et al. |
| 2004/0137378 A1 | 7/2004 | Sugeta et al. |
| 2006/0099347 A1 | 5/2006 | Sugeta et al. |

FOREIGN PATENT DOCUMENTS

| JP | 2000-267269 | 9/2000 |
| JP | 2003-005374 | 1/2003 |
| JP | 2005-010488 | 1/2005 |

OTHER PUBLICATIONS

International Search Report from PCT/JP2006/301127 dated Feb. 21, 2006.

* cited by examiner

*Primary Examiner*—John S Chu
(74) *Attorney, Agent, or Firm*—Knobbe, Martens, Olson & Bear, LLP

(57) ABSTRACT

A positive resist composition includes a resin component (A) that exhibits increased alkali solubility under the action of acid, and an acid generator component (B) that generates acid upon exposure, wherein the resin component (A) is a mixture of a copolymer (A1) that includes a structural unit (a1) derived from an acrylate ester that contains an acid-dissociable, dissolution-inhibiting group, a structural unit (a2) derived from a methacrylate ester that contains a lactone-containing monocyclic group, and a structural unit (a3) derived from an acrylate ester that contains a polar group-containing polycyclic group, and a copolymer (A2) that has a different structure from the copolymer (A1) and has a lower hydrophilicity than the copolymer (A1).

12 Claims, No Drawings

POSITIVE RESIST COMPOSITION AND METHOD FOR RESIST PATTERN FORMATION

TECHNICAL FIELD

The present invention relates to a positive resist composition and a method for resist pattern formation.

Priority is claimed on Japanese Patent Application No. 2005-024869, filed Feb. 1, 2005, the content of which is incorporated herein by reference.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultra violet radiation typified by g-line and i-line radiation has been used, but nowadays KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), EUV (extreme ultra violet radiation), and EB (electron beams) and the like as the light source (radiation source).

Resists for use with these types of short wavelength light sources require a high resolution capable of reproducing patterns of minute dimensions, and a high level of sensitivity relative to these types of short wavelength light sources. One example of a known resist that satisfies these conditions is a chemically amplified resist, which includes a base resin and an acid generator that generates acid upon exposure (for example, see patent reference 1). These chemically amplified resists include positive resists in which the alkali solubility of the exposed portions increases, and negative resists in which the alkali solubility of the exposed portions decreases.

These types of resists require favorable lithography characteristics (including resolution, depth of focus characteristics, and resist pattern shape and the like).

Moreover, in recent years, as the demands for higher resolution resist patterns have increased, in addition to the characteristics described above, an improvement in the level of defects (surface defects) within the developed resist pattern is also required. These defects refer to general abnormalities detected by inspection of the resist pattern following developing, from directly above the resist pattern, using a surface defect inspection device such as that manufactured by KLA Tencor Corporation (brand name: KLA). Examples of these abnormalities include post-developing scum, foam, dust, bridges across different portions of the resist pattern, color irregularities, and precipitated deposits. Particularly in the case of formation of very fine resist patterns of 130 nm or smaller using an ArF excimer laser or more recent light source, namely an ArF excimer laser, a $F_2$ excimer laser, EUV or EB or the like, the problems associated with resolving these defects have become even more demanding.

[Patent Reference 1]

Japanese Unexamined Patent Application, First Publication No. 2003-167347

DISCLOSURE OF INVENTION

However, conventional resist compositions have proven incapable of achieving both a reduced level of defects and excellent lithography characteristics. For example, one possible method of reducing the level of defects is a method that involves increasing the hydrophilicity of the base resin, thereby suppressing the occurrence of post-developing deposits and the like. However, increasing the hydrophilicity of the base resin is usually accompanied by a deterioration in the lithography characteristics.

The present invention takes the above circumstances into consideration, with an object of providing a positive resist composition and a method for resist pattern formation that are capable of forming resist patterns with excellent lithography characteristics and reduced levels of defects.

In order to achieve the above object, the present invention adopts the aspects described below.

A first aspect of the present invention is a positive resist composition including a resin component (A) that exhibits increased alkali solubility under the action of acid, and an acid generator component (B) that generates acid upon exposure, wherein the resin component (A) is a mixture of a copolymer (A1) that includes a structural unit (a1) derived from an acrylate ester that contains an acid-dissociable, dissolution-inhibiting group, a structural unit (a2) derived from a methacrylate ester that contains a lactone-containing monocyclic group, and a structural unit (a3) derived from an acrylate ester that contains a polar group-containing polycyclic group, and a copolymer (A2) that has a different structure from the copolymer (A1) and has a lower hydrophilicity than the copolymer (A1).

A second aspect of the present invention is a method for resist pattern formation that includes the steps of: forming a resist film on a substrate using the positive resist composition of the first aspect, conducting exposure of the resist film, and developing the resist film to form a resist pattern.

In the present invention, the expression "(α-lower alkyl) acrylate ester" is a generic term that includes either one of, or both, α-lower alkyl acrylate esters such as a methacrylate ester, and an acrylate ester. The term "α-lower alkyl acrylate ester" refers to a structure in which the hydrogen atom bonded to the α-carbon atom of the acrylate ester has been substituted with a lower alkyl group.

The term "structural unit" refers to a monomer unit that contributes to the formation of a polymer.

The expression "structural unit derived from an acrylate ester" refers to a structural unit that is formed by the cleavage of the ethylenic double bond of an acrylate ester.

The expression "structural unit derived from a methacrylate ester" refers to a structural unit that is formed by the cleavage of the ethylenic double bond of a methacrylate ester.

The expression "structural unit derived from an α-lower alkyl acrylate ester" refers to a structural unit that is formed by cleavage of the ethylenic double bond of an α-lower alkyl acrylate ester.

The expression "structural unit derived from an (α-lower alkyl)acrylate ester" refers to a structural unit that is formed by cleavage of the ethylenic double bond of an (α-lower alkyl)acrylate ester.

An "alkyl group", unless stated otherwise, includes straight-chain, branched-chain, and cyclic monovalent saturated hydrocarbon groups.

The term "exposure" is used as a general concept that includes irradiation with any form of radiation.

The present invention is able to provide a positive resist composition and a method for resist pattern formation that are capable of forming resist patterns with excellent lithography characteristics and reduced levels of defects.

BEST MODE FOR CARRYING OUT THE INVENTION

Positive Resist Composition

A positive resist composition according to the present invention includes a resin component (A) (hereafter referred to as the component (A)) that exhibits increased alkali solubility under the action of acid, and an acid generator component (B) (hereafter referred to as the component (A)) that generates acid upon exposure.

In a positive resist composition of the present invention, because the component (A) includes a structural unit (a1) that contains an acid-dissociable, dissolution-inhibiting group, the component (A) is insoluble in alkali prior to exposure, but the action of the acid generated from the component (B) upon exposure causes the acid-dissociable, dissolution-inhibiting group to dissociate, thereby increasing the alkali solubility of the entire component (A), and causing the resin component to change from an alkali-insoluble state to an alkali-soluble state. As a result, when the resist film obtained using the positive resist composition is selectively exposed during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern.

<Component (A)>

In the present invention, the component (A) must be a mixture of a copolymer (A1) and a copolymer (A2).

[Copolymer (A1)]

The copolymer (A1) contains a structural unit (a1), a structural unit (a2), and a structural unit (a3).

Structural Unit (a1)

The structural unit (a1) is a structural unit derived from an acrylate ester that contains an acid-dissociable, dissolution-inhibiting group.

In the structural unit (a1), a hydrogen atom is bonded to the α-carbon atom.

The acid-dissociable, dissolution-inhibiting group of the structural unit (a1) is a group that exhibits an alkali dissolution-inhibiting effect that renders the entire copolymer (A1) alkali-insoluble prior to exposure, but then dissociates under the action of the acid generated from the component (B) following exposure, causing the entire copolymer (A1) to change to an alkali-soluble state.

The acid-dissociable, dissolution-inhibiting group can be selected appropriately from the multitude of such groups proposed for use within resins for resist compositions designed for use with an ArF excimer laser. Typically, groups that form either a cyclic or chain-like tertiary alkyl ester, or a cyclic or chain-like alkoxyalkyl ester with the carboxyl group of (meth)acrylic acid are the most widely known. The term "(meth)acrylic acid" is a generic term that means acrylic acid and/or methacrylic acid.

Here, a tertiary alkyl ester describes a structure in which an ester is formed by substituting the hydrogen atom of a carboxyl group with a cyclic or chain-like alkyl group, and a tertiary carbon atom within the cyclic or chain-like alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The cyclic or chain-like alkyl group may contain a substituent group.

For example, examples of groups that form a chain-like tertiary alkyl ester include a tert-butyl group and a tert-amyl group.

Furthermore, examples of groups that form a tertiary alkyl ester include groups that contain a tertiary carbon atom within the ring skeleton of a cyclic alkyl group such as an adamantyl group, as shown below in the structural unit represented by a general formula (I), and specific examples include a 2-methyladamantyl group and 2-ethyladamantyl group. Other possible groups include those that contain a cyclic alkyl group, and a branched-chain alkylene group that contains a tertiary carbon atom and is bonded to the cyclic alkyl group, such as the group shown below within the structural unit represented by a general formula (II).

A cyclic or chain-like alkoxyalkyl ester describes a structure in which an ester is formed by substituting the hydrogen atom of a carboxyl group with an alkoxyalkyl group, wherein the alkoxyalkyl group is bonded to the oxygen atom at the terminal of the carbonyloxy group (—C(O)—O—). In this type of alkoxyalkyl ester, the action of acid causes cleavage of the bond between the oxygen atom and the alkoxyalkyl group.

Examples of suitable cyclic or chain-like alkoxyalkyl groups include a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a1), structural units that include an acid-dissociable, dissolution-inhibiting group that contains a cyclic group, and particularly an aliphatic cyclic group, are preferred. In this description and in the claims, the term "aliphatic" is a relative concept used in relation to the term "aromatic", and defines a group or compound or the like that contains no aromaticity. The term "aliphatic cyclic group" describes a monocyclic group or polycyclic group that contains no aromaticity.

The aliphatic cyclic group may be either monocyclic or polycyclic, and can be selected appropriately from the multitude of groups proposed for use within ArF resists and the like, although from the viewpoint of ensuring favorable etching resistance, a polycyclic aliphatic cyclic group is preferred. Furthermore, the aliphatic cyclic group is preferably a hydrocarbon group (an alicyclic group), and is even more preferably a saturated alicyclic group.

Examples of suitable monocyclic alicyclic groups include groups in which one hydrogen atom has been removed from a monocycloalkane. Examples of suitable polycyclic alicyclic groups include groups in which one hydrogen atom has been removed from a bicycloalkane, tricycloalkane or tetracycloalkane or the like.

Specifically, examples of suitable monocyclic alicyclic groups include a cyclopentyl group or cyclohexyl group. Examples of suitable polycyclic alicyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a1) is preferably at least one unit selected from the general formulas (I) to (III) shown below.

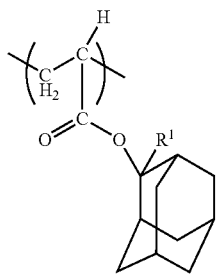

(I)

[In the formula (I), R¹ represents a lower alkyl group.]

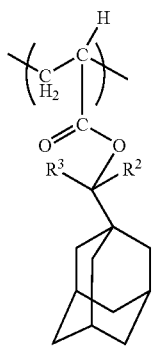

(II)

[In the formula (II), R² and R³ each represent, independently, a lower alkyl group.]

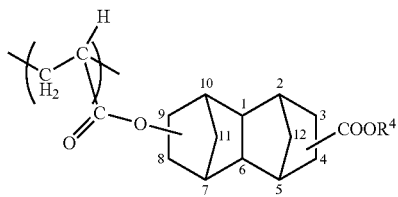

(III)

[In the formula (III), R⁴ represents a tertiary alkyl group.]

The lower alkyl group of $R^1$ is preferably an alkyl group of 1 to 5 carbon atoms, and is preferably a straight-chain or branched alkyl group, and specific examples include a methyl group, ethyl group, propyl group, isopropyl group, n-butyl group, isobutyl group, pentyl group, isopentyl group, and neopentyl group. Of these, a methyl group or ethyl group is preferred from the viewpoint of industrial availability.

The lower alkyl groups of $R^2$ and $R^3$ each represent, independently, an alkyl group of 1 to 5 carbon atoms, and preferably represent a straight-chain or branched lower alkyl group of 1 to 5 carbon atoms. Of the various possibilities, those cases in which $R^2$ and $R^3$ are both methyl groups are preferred industrially, and a structural unit derived from 2-(1-adamantyl)-2-propyl acrylate is a specific example.

The group $R^4$ is preferably a chain-like tertiary alkyl group or a cyclic tertiary alkyl group, and preferably contains from 4 to 7 carbon atoms. Specific examples of suitable chain-like tertiary alkyl groups include a tert-butyl group or tert-amyl group, although a tert-butyl group is preferred industrially. A tertiary alkyl group refers to an alkyl group that contains a tertiary carbon atom.

Examples of cyclic tertiary alkyl groups include the same groups as those exemplified above in relation to the "acid-dissociable, dissolution-inhibiting group that contains an aliphatic cyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group or 1-methylcyclopentyl group.

Furthermore, the group —COOR⁴ may be bonded to either position 3 or 4 of the tetracyclododecanyl group shown in the formula, although the bonding position cannot be further specified. Furthermore, the carboxyl group residue of the acrylate structural unit may be bonded to either position 8 or 9 within the formula, although similarly, the bonding position cannot be further specified.

A structural unit represented by the general formula (I) is preferred as the structural unit (a1), and the structural unit in which $R^1$ is a methyl group is particularly desirable.

The structural unit (a1) may use either a single structural unit, or a combination of two or more different structural units.

The proportion of the structural unit (a1) within the copolymer (A1), relative to the combined total of all the structural units that constitute the copolymer (A1), is preferably within a range from 20 to 60 mol %, even more preferably from 30 to 50 mol %, and is most preferably from 35 to 45 mol %. By ensuring that this proportion is at least as large as the lower limit of the above range, a favorable pattern can be obtained, whereas ensuring that the proportion is no greater than the upper limit enables a favorable balance to be achieved with the other structural units.

Structural Unit (a2)

The structural unit (a2) is a structural unit derived from a methacrylate ester that contains a lactone-containing monocyclic group In the structural unit (a2), a methyl group is bonded to the α-carbon atom.

Examples of the structural unit (a2) include structural units in which a monocyclic group formed from a lactone ring is bonded to the ester side-chain portion of the methacrylate ester.

In the present invention, the term lactone ring refers to a single ring containing a —O—C(O)— structure, and this ring is counted as the first ring. In other words, the case in which the only ring structure is the lactone ring is referred to as a monocyclic group, and groups containing other ring structures are described as polycyclic groups regardless of the structure of the other rings.

Specific examples of the structural unit (a2) include structural units represented by a general formula (IV) shown below, such as structural units containing a monocyclic group in which one hydrogen atom has been removed from γ-butyrolactone.

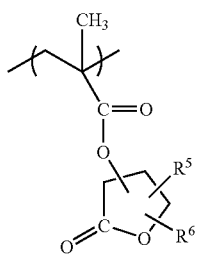

(IV)

[In the formula (IV), $R^5$ and $R^6$ each represent, independently, a hydrogen atom or a lower alkyl group.]

In the formula (IV), $R^5$ and $R^6$ each represent, independently, a hydrogen atom or a lower alkyl group, and preferably represent a hydrogen atom. Suitable lower alkyl groups for the groups $R^5$ and $R^6$ are preferably straight-chain or branched alkyl groups of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, structural units represented by the general formula (IV) are preferred in terms of reducing defects, and of the possible structural units represented by the formula (IV), α-methacryloyloxy-γ-butyrolactone, in which $R^5$ and $R^6$ are both hydrogen atoms, and the position of the ester linkage between the methacrylate ester and the γ-butyrolactone is at the α-position of the lactone ring, is the most desirable.

The structural unit (a2) may use either a single structural unit, or a combination of two or more different structural units.

The proportion of the structural unit (a2) within the copolymer (A1), relative to the combined total of all the structural units that constitute the copolymer (A1), is preferably within a range from 20 to 60 mol %, even more preferably from 20 to 50 mol %, and is most preferably from 30 to 45 mol %. Ensuring that this proportion is at least as large as the lower limit of the above range improves the lithography characteristics, whereas ensuring that the proportion is no greater than the upper limit enables a favorable balance to be achieved with the other structural units.

Structural Unit (a3)

The structural unit (a3) is a structural unit derived from an acrylate ester that contains a polar group-containing polycyclic group. Including the structural unit (a3) increases the hydrophilicity of the entire copolymer (A1), thereby improving the affinity with the developing solution and reducing the level of defects. Furthermore, the alkali solubility within the exposed portions also improves, contributing to an improvement in the resolution.

In the structural unit (a3), a hydrogen atom is bonded to the α-carbon atom.

Examples of the polar group include a hydroxyl group, cyano group, carboxyl group, or amino group or the like, although a hydroxyl group is particularly preferred.

Examples of the polycyclic group include polycyclic aliphatic hydrocarbon groups (polycyclic alicyclic groups). Specific examples of these polycyclic alicyclic groups include groups selected from amongst the same plurality of polycyclic alicyclic groups exemplified above in relation to the structural unit (a1).

The structural unit (a3) is preferably at least one unit selected from the general formulas (VIII) through (IX) shown below.

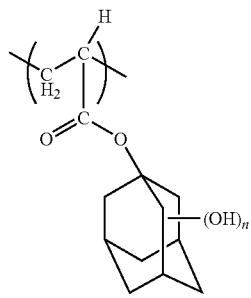

(VIII)

[In the formula (VIII), n represents an integer from 1 to 3.]

Of these units, structural units in which n is 1, and the hydroxyl group is bonded to position 3 of the adamantyl group are preferred.

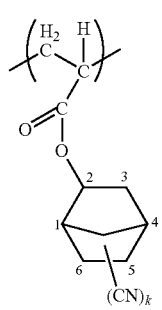

(IX)

[In the formula (IX), k represents an integer from 1 to 3.]

Of these units, structural units in which k is 1 are preferred. Furthermore, the cyano group is preferably bonded to position 5 or position 6 of the norbornyl group.

The structural unit (a3) may use either a single structural unit, or a combination of two or more different structural units.

The proportion of the structural unit (a3) within the copolymer (A1), relative to the combined total of all the structural units that constitute the copolymer (A1), is preferably within a range from 10 to 50 mol %, even more preferably from 15 to 40 mol %, and is most preferably from 20 to 35 mol %. Ensuring that this proportion is at least as large as the lower limit of the above range improves the lithography characteristics, whereas ensuring that the proportion is no greater than the upper limit enables a favorable balance to be achieved with the other structural units.

Other Structural Units

The copolymer (A1) may also include other structural units besides the aforementioned structural units (a1) through (a3). Specifically, the combined total of these structural units (a1) through (a3), relative to the combined total of all the structural units that constitute the copolymer (A1), is preferably at least 70 mol %, is even more preferably 80 mol % or greater, and is most preferably 100 mol %.

There are no particular restrictions on these other structural units besides the aforementioned structural units (a1) through (a3), which may be any other structural unit that cannot be classified as one of the above structural units (a1) through (a3).

Examples of these other structural units include structural units (a4) that contain a polycyclic aliphatic hydrocarbon group (alicyclic group) and are derived from an (α-lower alkyl)acrylate ester. Examples of the polycyclic alicyclic group include the same groups exemplified above in relation to the structural unit (a1), and in terms of factors such as industrial availability, one or more groups selected from amongst a tricyclodecanyl group, adamantyl group, tetracyclododecanyl group, norbornyl group, and isobornyl group is particularly preferred.

Specific examples of the structural unit (a4) include units of the structures (X) to (XII) shown below.

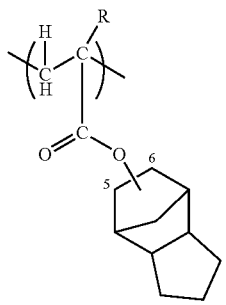
(X)

(wherein, R represents a hydrogen atom or a lower alkyl group)

This structural unit typically exists as a mixture of the isomers in which the bonding position is either position 5 or position 6.

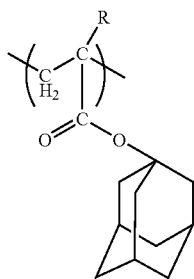
(XI)

(wherein, R represents a hydrogen atom or a lower alkyl group)

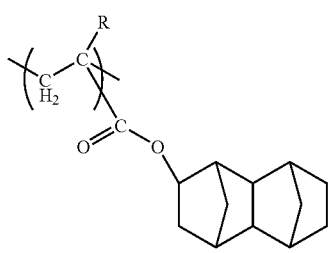
(XII)

(wherein, R represents a hydrogen atom or a lower alkyl group)

In the above formulas, examples of the lower alkyl group represented by R include alkyl groups of 1 to 5 carbon atoms, and straight-chain or branched alkyl groups are preferred, with specific examples including a methyl group, ethyl group, propyl group, isopropyl group, n-butyl group, isobutyl group, tert-butyl group, pentyl group, isopentyl group, and neopentyl group. A methyl group is preferred industrially.

In those cases where a structural unit (a4) is included, the proportion of the structural unit (a4) within the copolymer (A1), relative to the combined total of all the structural units that constitute the copolymer (A1), is preferably within a range from 1 to 25 mol %, and is even more preferably from 5 to 20 mol %.

The copolymer (A1) is preferably a copolymer that includes at least the three structural units represented by a general formula (A1-1) shown below, and copolymers formed solely from these structural units are even more desirable.

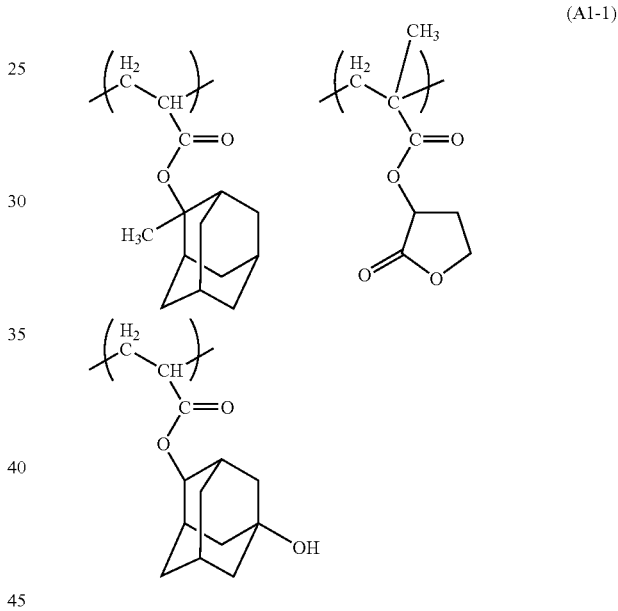
(A1-1)

The copolymer (A1) preferably has a contact angle of no more than 40 degrees, as such a value yields a particularly superior reduction in the level of defects.

"A contact angle of no more than 40 degrees" means that the copolymer (A1) satisfies the condition described below (condition 1).

(Condition 1) A resist film is formed on a support using a positive resist composition in which the component (A) includes solely the copolymer (A1), and following application of a developing solution to the surface of the resist film, the measured value of the contact angle at the surface of the resist film is no more than 40 degrees.

Here, the expression "a positive resist composition in which the component (A) includes solely the copolymer (A1)" refers to a positive resist composition in which the component (A) is formed solely from the copolymer (A1), meaning that in a positive resist composition according to the present invention, the copolymer (A2) within the component (A) has been replaced with the copolymer (A1).

The measured value of the contact angle mentioned above is measured in the manner described below.

1) First, a positive resist composition formed using solely the copolymer (A1) is prepared.

2) Subsequently, 1 ml of an organic solvent solution of the positive resist composition (with a solid fraction concentration of 8% by weight) is spin coated at a rate of revolution of 1,500 rpm onto the surface of a silicon substrate having a diameter of 6 inches, and is then heated for 90 seconds at a temperature of 90° C., thereby forming a resist film.

3) Using a developing apparatus [product name: TD6133U (manufactured by Tazmo Co., Ltd.)], a 2.38% by weight aqueous solution of tetramethylammonium hydroxide (the alkali developing solution) is dripped onto the surface of the above resist film at a temperature of 23° C. for a period of 30 seconds, and the resist film is then spun dry for 20 seconds at a revolution rate of 1,500 rpm.

4) Using a FACE contact angle meter CA-X150 (a product name, manufactured by Kyowa Interface Science Co., Ltd.), the injector fitted to the apparatus is brought into contact with the dried resist film (on contact between the injector and the resist film, 2 μL of pure water is released onto the resist film surface), and the contact angle is measured.

The lower limit for the contact angle is typically at least 25 degrees, and contact angles of 30 degrees or greater are preferred. Ensuring the contact angle is at least 25 degrees not only enables a reduction in the level of defects, but also enables favorable lithography characteristics such as resolution and DOF (depth of focus) to be obtained.

A preferred contact angle value is within a range from 30 to 40 degrees, even more preferably from 32 to 40 degrees, even more preferably from 35 to 40 degrees, and is most preferably from 36 to 39 degrees.

The copolymer (A1) can be obtained, for example, by a conventional radical polymerization or the like of the monomers that yield each of the structural units, using a radical polymerization initiator such as azobisisobutyronitrile (AIBN).

The weight average molecular weight (the polystyrene equivalent weight average molecular weight determined by gel permeation chromatography, this also applies below) of the copolymer (A1) is preferably no more than 30,000, even more preferably no more than 20,000, even more preferably 12,000 or lower, and is most preferably 10,000 or lower. There are no particular restrictions on the lower limit for the weight average molecular weight, although from the viewpoints of inhibiting pattern collapse and achieving a favorable improvement in resolution and the like, the weight average molecular weight is preferably at least 4,000, and even more preferably 5,000 or greater.

In the component (A), either a single copolymer (A1) may be used alone, or a combination of two or more different copolymers may be used.

[Copolymer (A2)]

There are no particular restrictions on the copolymer (A2), which may be any copolymer that has a different structure from the copolymer (A1) and has a lower hydrophilicity than the copolymer (A1), and any of the resins proposed for use as the base resin within chemically amplified positive resists can be used.

The expression "has a different structure from the copolymer (A1)" means that the copolymer (A2) does not simultaneously contain the structural unit (a1), the structural unit (a2) and the structural unit (a3). Examples of the copolymer (A2) include copolymers that contain none of the structural unit (a1), the structural unit (a2) and the structural unit (a3), as well as copolymers that contain either one or two of the structural unit (a1), the structural unit (a2) and the structural unit (a3).

In addition, the copolymer (A2) must have a lower hydrophilicity than the copolymer (A1).

The determination as to whether or not a copolymer has a lower hydrophilicity than the copolymer (A1) can be made on the basis of the measured values of the respective contact angles. In other words, the measured value for the contact angle is determined by substituting the copolymer (A1) with the copolymer (A2) in the contact angle measurement method described above in the section relating to the copolymer (A1), and if this measured value is greater than the measured value of the contact angle for the copolymer (A1), then the copolymer (A2) can be confirmed as having a lower hydrophilicity than the copolymer (A1).

In the present invention, the copolymer (A2) preferably satisfies the condition 2 described below, as such copolymers exhibit particularly superior improvement in the lithography characteristics.

(Condition 2) A resist film is formed on a support using a positive resist composition formed using solely the copolymer (A2), and following application of a developing solution to the surface of the resist film, the measured value of the contact angle at the surface of the resist film is at least 45 degrees but no more than 60 degrees.

This measured value of the contact angle is even more preferably at least 50 degrees but no more than 60 degrees.

Here, the expression "a positive resist composition formed using solely the copolymer (A2)" refers to a positive resist composition in which the component (A) is formed solely from the copolymer (A2), meaning that in a positive resist composition according to the present invention, the copolymer (A1) within the component (A) has been replaced with the copolymer (A2).

The copolymer (A2) preferably exhibits a contact angle of at least 45 degrees but no more than 60 degrees, as such copolymers exhibit particularly superior improvement in the lithography characteristics.

The expression "a contact angle of at least 45 degrees but no more than 60 degrees" means that the copolymer (A2) satisfies the condition 2 described below.

(Condition 2)

1) First, a positive resist composition formed using solely the copolymer (A2) is prepared.

2) Subsequently, 1 ml of an organic solvent solution of the positive resist composition (with a solid fraction concentration of 8% by weight) is spin coated at a rate of revolution of 1,500 rpm onto the surface of a silicon substrate having a diameter of 6 inches, and is then heated for 90 seconds at a temperature of 90° C., thereby forming a resist film.

3) Using a developing apparatus [product name: TD6133U (manufactured by Tazmo Co., Ltd.)], a 2.38% by weight aqueous solution of tetramethylammonium hydroxide (the alkali developing solution) is dripped onto the surface of the above resist film at a temperature of 23° C. for a period of 30 seconds, and the resist film is then spun dry for 20 seconds at a revolution rate of 1,500 rpm.

4) Using a FACE contact angle meter CA-X150 (a product name, manufactured by Kyowa Interface Science Co., Ltd.), the injector fitted to the apparatus is brought into contact with the dried resist film (on contact between the injector and the resist film, 2 μL of pure water is released onto the resist film surface), the contact angle is measured, and the measured value is at least 45 degrees but no more than 60 degrees.

As the copolymer (A2), copolymers that include structural units derived from (α-lower alkyl)acrylate esters are preferred, as they exhibit superior transparency to ArF excimer lasers and the like, and exhibit superior lithography characteristics such as resolution.

These structural units derived from (α-lower alkyl)acrylate esters may include only structural units derived from acrylate esters, or only structural units derived from α-lower alkyl acrylate esters, but copolymers that include both structural units derived from acrylate esters and structural units derived from α-lower alkyl acrylate esters are preferred.

In the copolymer (A2), the proportion of structural units derived from acrylate esters, relative to the combined total of all the structural units that constitute the copolymer (A2), is preferably within a range from 20 to 80 mol %, and is even more preferably from 40 to 60 mol %. By ensuring that this proportion is no greater than the upper limit of the above range, superior lithography characteristics can be obtained, whereas ensuring that the proportion is at least as large as the lower limit yields more favorable etching resistance.

In terms of ensuring particularly superior effects for the present invention, the copolymer (A2) preferably includes a structural unit (a1') derived from an (α-lower alkyl)acrylate ester that contains an acid-dissociable, dissolution-inhibiting group, a structural unit (a2') derived from an (α-lower alkyl) acrylate ester that contains a lactone-containing monocyclic or polycyclic group, and a structural unit (a3') derived from an (α-lower alkyl)acrylate ester that contains a polar group-containing polycyclic group.

Structural Unit (a1')

In the structural unit (a1'), a hydrogen atom or a lower alkyl group is bonded to the α-carbon atom.

The lower alkyl group bonded to the α-carbon atom is preferably an alkyl group of 1 to 5 carbon atoms, and is preferably a straight-chain or branched alkyl group, and suitable examples include a methyl group, ethyl group, propyl group, isopropyl group, n-butyl group, isobutyl group, tert-butyl group, pentyl group, isopentyl group, or neopentyl group. Of these, a methyl group is preferred industrially.

In the structural unit (a1'), a hydrogen atom is preferably bonded to the α-carbon atom.

Examples of the structural unit (a1') include the aforementioned structural unit (a1) derived from an acrylate ester that contains an acid-dissociable, dissolution-inhibiting group, and structural units derived from an α-lower alkyl acrylate ester that contains an acid-dissociable, dissolution-inhibiting group, in which the hydrogen atom bonded to the α-carbon atom within the above structural unit (a1) has been substituted with a lower alkyl group.

Preferred examples of the structural unit (a1') include the structural units represented by the above general formulas (I) through (III), and structural units in which the hydrogen atom bonded to the α-carbon atom within these structural units has been substituted with a lower alkyl group. Examples of this lower alkyl group include the same groups as those described above in relation to the lower alkyl group bonded to the α-carbon atom.

As the structural unit (a1'), structural units represented by the above general formula (I), and structural units in which the hydrogen atom bonded to the α-carbon atom within this formula has been substituted with a lower alkyl group are preferred, and of these, structural units in which $R^1$ is a straight-chain alkyl group of two or more carbon atoms are preferred, and structural units in which $R^1$ is an ethyl group are particularly desirable.

The structural unit (a1') may use either a single structural unit, or a combination of two or more different structural units.

The proportion of the structural unit (a1') within the copolymer (A2), relative to the combined total of all the structural units that constitute the copolymer (A2), is preferably within a range from 20 to 60 mol %, even more preferably from 30 to 50 mol %, and is most preferably from 35 to 50 mol %. By ensuring that this proportion is at least as large as the lower limit of the above range, a favorable pattern can be obtained, whereas ensuring that the proportion is no greater than the upper limit enables a favorable balance to be achieved with the other structural units.

Structural Unit (a2')

In the structural unit (a2'), a hydrogen atom or a lower alkyl group is bonded to the α-carbon atom.

Examples of the lower alkyl group include the same groups as those exemplified above in relation to the lower alkyl group bonded to the α-carbon atom within the structural unit (a1').

In the structural unit (a2'), a lower alkyl group is preferably bonded to the α-carbon atom, and a methyl group is particularly desirable.

Examples of the structural unit (a2') include structural units in which a monocyclic group formed from a lactone ring or a polycyclic cyclic group that includes a lactone ring is bonded to the ester side-chain portion of an (α-lower alkyl)acrylate ester.

As described above, the term lactone ring refers to a single ring containing a —O—C(O)— structure, and cases in which the only ring structure is the lactone ring are referred to as monocyclic groups, and groups containing other ring structures are described as polycyclic groups.

As the structural unit (a2'), any group can be used without any particular restrictions, provided it includes both the above type of lactone structure (—O—C(O)—) and a cyclic group.

Specifically, examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane, or tetracycloalkane.

As the structural unit (a2'), structural units derived from an α-lower alkyl)acrylate ester that contains a lactone-containing polycyclic group are particularly preferred as they yield particularly superior lithography characteristics.

Groups obtained by removing one hydrogen atom from a lactone-containing tricycloalkane with a structural formula such as those shown below are particularly preferred in terms of factors such as industrial availability.

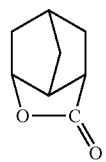 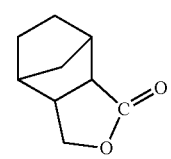

More specific examples of the structural unit (a2') include the structural units represented by general formulas (a2-1) to (a2-5) shown below.

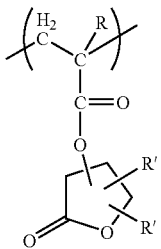
(a2-1)

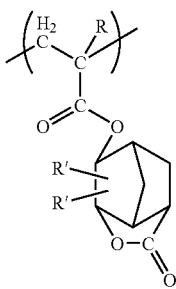
(a2-2)

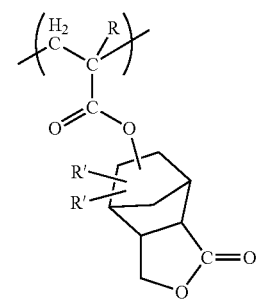
(a2-3)

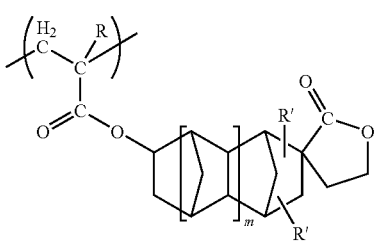
(a2-4)

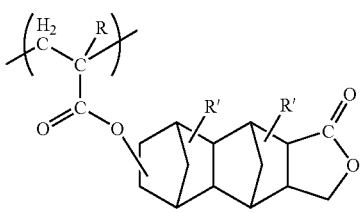
(a2-5)

[wherein, R represents a hydrogen atom, or a lower alkyl group, R' represents a hydrogen atom, a lower alkyl group, or an alkoxy group of 1 to 5 carbon atoms, and m represents an integer of 0 or 1]

The lower alkyl groups R and R' within the general formulas (a2-1) to (a2-5) are as defined above for the lower alkyl group R in the above formulas (X) through (XII). R is preferably a methyl group.

Considering factors such as industrial availability, R' within the general formulas (a2-1) to (a2-5) is preferably a hydrogen atom.

The structural unit (a2') may use either a single structural unit, or a combination of two or more different structural units.

The proportion of the structural unit (a2') within the copolymer (A2), relative to the combined total of all the structural units that constitute the copolymer (A2), is preferably within a range from 20 to 60 mol %, even more preferably from 20 to 50 mol %, and is most preferably from 30 to 40 mol %. By ensuring that this proportion is at least as large as the lower limit of the above range, the lithography characteristics can be improved, whereas ensuring that the proportion is no greater than the upper limit enables a favorable balance to be achieved with the other structural units.

Structural Unit (a3')

In the structural unit (a3'), a hydrogen atom or a lower alkyl group is bonded to the α-carbon atom.

Examples of the lower alkyl group include the same groups as those exemplified above in relation to the lower alkyl group bonded to the α-carbon atom within the structural unit (a1').

In the structural unit (a3'), a hydrogen atom is preferably bonded to the α-carbon atom.

Examples of the structural unit (a3') include the aforementioned structural unit (a3) derived from an acrylate ester that contains a polar group-containing polycyclic group, and structural units derived from an α-lower alkyl acrylate ester that contains a polar group-containing polycyclic group, in which the hydrogen atom bonded to the α-carbon atom within the above structural unit (a3) has been substituted with a lower alkyl group.

Preferred examples of the structural unit (a3') include the structural units represented by the above general formulas (VIII) through (IX), and structural units in which the hydrogen atom bonded to the α-carbon atom within these structural units has been substituted with a lower alkyl group. Examples of this lower alkyl group include the same groups as those described above in relation to the lower alkyl group bonded to the α-carbon atom.

The structural unit (a3') may use either a single structural unit, or a combination of two or more different structural units.

The proportion of the structural unit (a3') within the copolymer (A2), relative to the combined total of all the structural units that constitute the copolymer (A2), is preferably within a range from 10 to 50 mol %, even more preferably from 15 to 40 mol %, and is most preferably from 20 to 35 mol %. By ensuring that this proportion is at least as large as the lower limit of the above range, the lithography characteristics can be improved, whereas ensuring that the proportion is no greater than the upper limit enables a favorable balance to be achieved with the other structural units.

Other Structural Units

The copolymer (A2) may also include other structural units besides the structural units (a1') to (a3') described above. Ideally, the proportion of the copolymer (A2) accounted for by the combination of the structural units (a1') to (a3'), relative to the combined total of all the structural units that constitute the copolymer (A2), is at least 70 mol %, even more preferably 80 mol % or greater, and is most preferably 100 mol %.

Examples of other structural units besides the structural units (a1') to (a3') include any other structural unit that cannot be classified as one of the above structural units (a1') to (a3'), and there are no particular restrictions. Examples of such structural units include the structural unit (a4) described above.

If a structural unit (a4) is included, then the proportion of the structural unit (a4), relative to the combined total of all the structural units that constitute the copolymer (A2), is preferably within a range from 1 to 25 mol %, and is even more preferably from 5 to 20 mol %.

Specific examples of the copolymer (A2) are shown below.

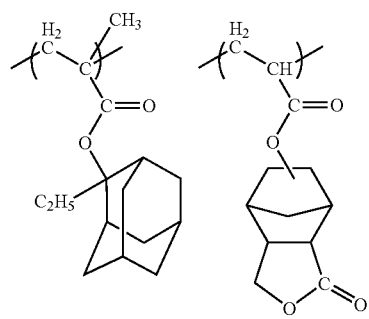

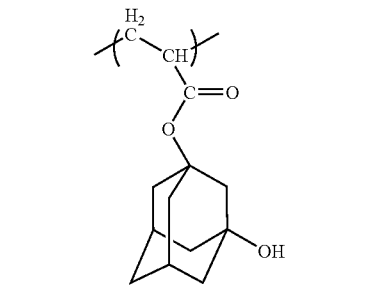

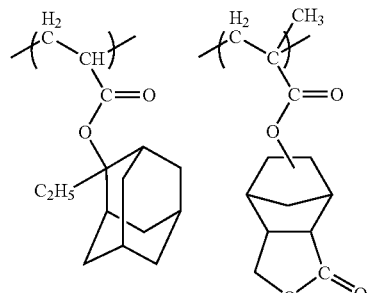

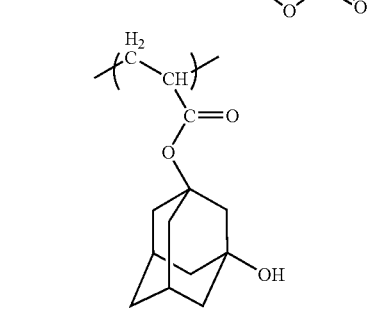

-continued

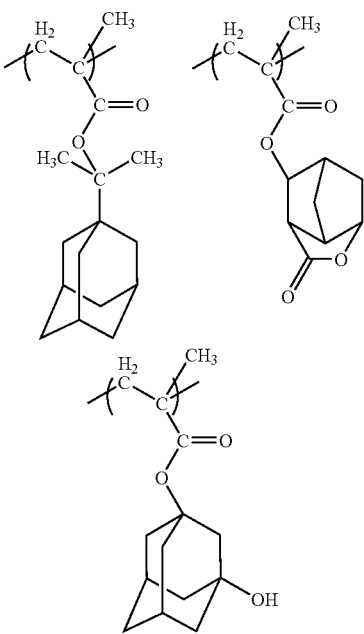

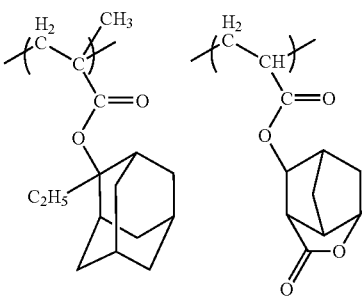

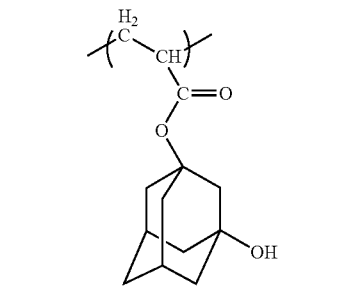

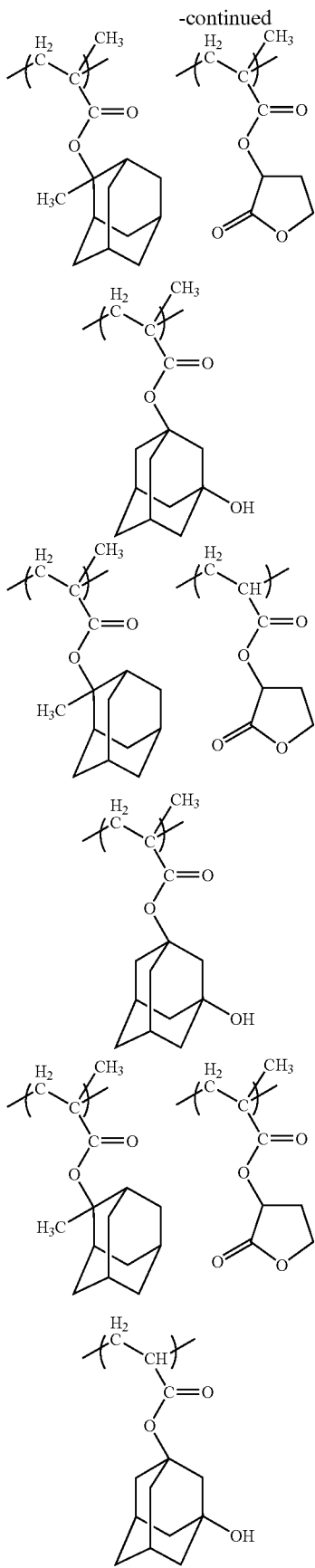
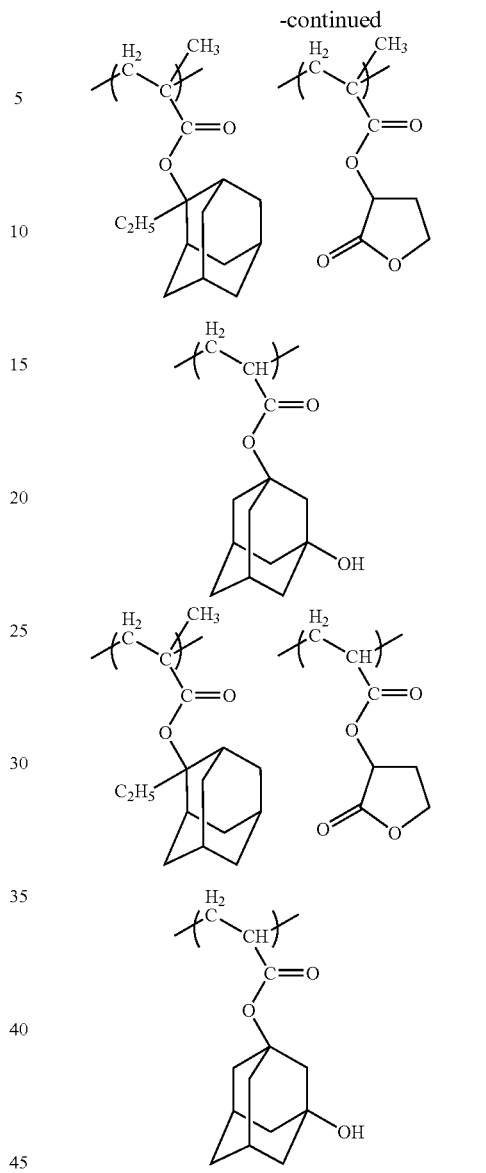
As the copolymer (A2), copolymers that include at least the three structural units represented by a general formula (A2-1) shown below are preferred, and copolymers formed solely from these structural units are particularly desirable.
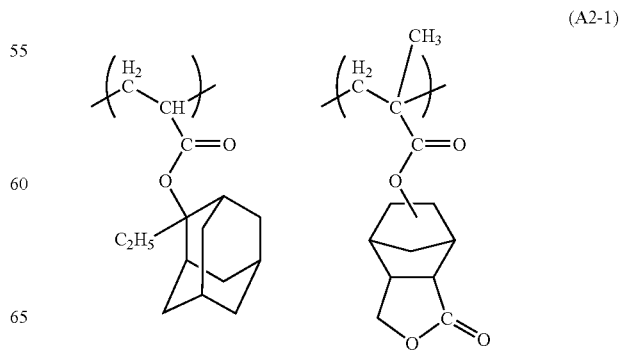
(A2-1)

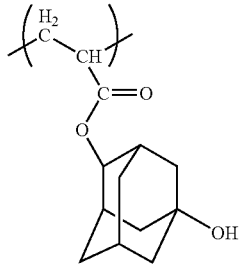

-continued

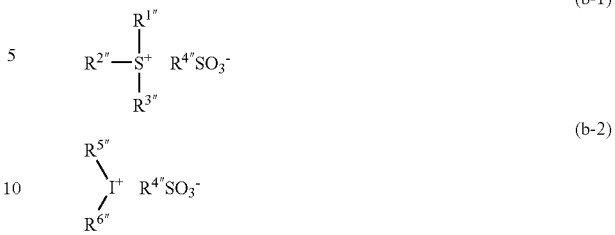

The copolymer (A2) can be obtained, for example, by a conventional radical polymerization or the like of the monomers that yield each of the structural units, using a radical polymerization initiator such as azobisisobutyronitrile (AIBN).

The weight average molecular weight (the polystyrene equivalent weight average molecular weight determined by gel permeation chromatography, this also applies below) of the copolymer (A2) is preferably no more than 30,000, even more preferably no more than 20,000, even more preferably 12,000 or lower, and is most preferably 10,000 or lower. There are no particular restrictions on the lower limit of the weight average molecular weight, although from the viewpoints of inhibiting pattern collapse and achieving a favorable improvement in resolution and the like, the weight average molecular weight is preferably at least 4,000, and even more preferably 5,000 or greater.

In the component (A), either a single copolymer (A2) may be used alone, or a combination of two or more different copolymers may be used.

In the component (A), the mixing ratio (weight ratio) between the copolymer (A1) and the copolymer (A2) is preferably within a range such that copolymer (A1): copolymer (A2)=20:80 to 80:20, even more preferably from 30:70 to 60:40, even more preferably from 40:60 to 60:40, and most preferably from 45:55 to 55:45, as such ratios yield superior effects for the present invention.

The quantity of the component (A) within the positive resist composition of the present invention can be adjusted appropriately in accordance with the thickness of the resist film that is to be formed.

<Component (B)>

The component (B) can use any of the known acid generators proposed for use within conventional chemically amplified resist compositions without any particular restrictions. Examples of the types of acid generators that have been used are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of suitable onium salt-based acid generators include compounds represented by general formulas (b-1) and (b-2) shown below.

[wherein, $R^{1''}$ to $R^{3''}$, and $R^{5''}$ to $R^{6''}$ each represent, independently, an aryl group or an alkyl group; and $R^{4''}$ represents a straight-chain, branched or cyclic alkyl group or fluoroalkyl group; provided that at least one of $R^{1''}$ to $R^{3''}$ represents an aryl group, and at least one of $R^{5''}$ to $R^{6''}$ represents an aryl group]

In the formula (b-1), $R^{1''}$ to $R^{3''}$ each represent, independently, an aryl group or an alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group is the most desirable.

Alkoxy groups that may be used for substitution of the hydrogen atoms of the above aryl groups are preferably alkoxy groups of 1 to 5 carbon atoms, and a methoxy group or ethoxy group is the most desirable. Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Of the above possibilities, compounds in which $R^{1''}$ to $R^{3''}$ are all phenyl groups are the most preferred.

The group $R^{4''}$ represents a straight-chain, branched or cyclic alkyl group or fluoroalkyl group.

As the straight-chain or branched alkyl group, groups of 1 to 10 carbon atoms are preferred, groups of 1 to 8 carbon atoms are even more preferred, and groups of 1 to 4 carbon atoms are the most desirable.

Suitable cyclic alkyl groups include the same groups as those listed above in relation to the group $R^{1''}$, and cyclic groups of 4 to 15 carbon atoms are preferred, groups of 4 to 10 carbon atoms are even more preferred, and groups of 6 to 10 carbon atoms are the most desirable.

As the above fluoroalkyl group, groups of 1 to 10 carbon atoms are preferred, groups of 1 to 8 carbon atoms are even more preferred, and groups of 1 to 4 carbon atoms are the most desirable. Furthermore, the fluorination ratio of the fluoroalkyl group (namely, the fluorine atom proportion within the alkyl group) is preferably within a range from 10 to 100%, and even more preferably from 50 to 100%, and groups in which all of the hydrogen atoms have been substituted with fluorine atoms yield the strongest acids, and are consequently the most desirable.

The group $R^{4''}$ is most preferably a straight-chain or cyclic alkyl group, or a fluoroalkyl group.

In the formula (b-2), $R^{5''}$ to $R^{6''}$ each represent, independently, an aryl group or an alkyl group. At least one of $R^{5''}$ to $R^{6''}$ represents an aryl group. Compounds in which at least two of $R^{5''}$ to $R^{6''}$ represent aryl groups are preferred, and compounds in which all of $R^{5''}$ to $R^{6''}$ are aryl groups are the most preferred.

Suitable examples of the aryl groups of the groups $R^{5''}$ to $R^{6''}$ include the same aryl groups as those described above for the groups $R^{1''}$ to $R^{3''}$.

Suitable examples of the alkyl groups of the groups $R^{5''}$ to $R^{6''}$ include the same alkyl groups as those described above for the groups $R^{1''}$ to $R^{3''}$.

Of the above possibilities, compounds in which $R^{5''}$ to $R^{6''}$ are all phenyl groups are the most preferred.

Suitable examples of the group $R^{4''}$ in the formula (b-2) include the same groups as those described for the group $R^{4''}$ in the aforementioned formula (b-1).

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. Furthermore, onium salts in which the anion portion of the above onium salts has been substituted with a methanesulfonate, n-propanesulfonate, n-butanesulfonate, or n-octanesulfonate can also be used.

Compounds in which the anion portion within the above general formulas (b-1) and (b-2) has been substituted with an anion portion represented by a general formula (b-3) or (b-4) shown below (and in which the cation portion is the same as that shown in (b-1) or (b-2)) can also be used.

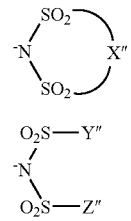

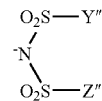

[wherein, X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom]

The group X" is a straight-chain or branched alkylene group in which at least one hydrogen atom has been substituted with a fluorine atom, and the number of carbon atoms within the alkylene group is typically within a range from 2 to 6, preferably from 3 to 5, and is most preferably 3.

Y" and Z" each represent, independently, a straight-chain or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene groups or perfluoroalkyl groups in which all of the hydrogen atoms have been substituted with fluorine atoms are the most desirable.

In the present invention, the term "oxime sulfonate-based acid generator" describes a compound that contains at least one group represented by a general formula (B-1) shown below, and generates acid upon irradiation. These types of oxime sulfonate-based acid generators are widely used within chemically amplified resist compositions, and any of these conventional compounds can be used.

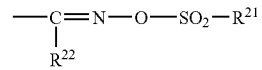

(In the formula (B-1), $R^{21}$ and $R^{22}$ each represent, independently, an organic group.)

In the present invention, the above organic groups preferably include carbon atoms, and may also include atoms other than carbon atoms (such as hydrogen atoms, oxygen atoms, nitrogen atoms, sulfur atoms, and halogen atoms (such as fluorine atoms or chlorine atoms)).

The organic group of $R^{21}$ is preferably a straight-chain, branched or cyclic alkyl group or aryl group. These alkyl groups or aryl groups may also include a substituent group. There are no particular restrictions on such substituent groups, and suitable examples include a fluorine atom or a straight-chain, branched or cyclic alkyl group of 1 to 6 carbon atoms. Here, the expression "include a substituent group" means that either a portion of, or all of, the hydrogen atoms of the alkyl group or aryl group may be substituted with substituent groups.

The alkyl group preferably contains from 1 to 20 carbon atoms, even more preferably from 1 to 10 carbon atoms, even more preferably from 1 to 8 carbon atoms, even more preferably from 1 to 6 carbon atoms, and most preferably from 1 to 4 carbon atoms. Furthermore, alkyl groups that are partially or completely halogenated (hereafter also referred to as haloalkyl groups) are preferred. A partially halogenated alkyl group is an alkyl group in which a portion of the hydrogen atoms have been substituted with halogen atoms, whereas a completely halogenated alkyl group is an alkyl group in which all of the hydrogen atoms have been substituted with halogen atoms. Examples of the halogen atoms include fluorine atoms, chlorine atoms, bromine atoms or iodine atoms, although fluorine atoms are particularly desirable. In other words, the haloalkyl group is preferably a fluoroalkyl group.

The aryl group preferably contains from 4 to 20 carbon atoms, even more preferably from 4 to 10 carbon atoms, and most preferably from 6 to 10 carbon atoms. Aryl groups that are partially or completely halogenated are preferred. A partially halogenated aryl group is an aryl group in which a portion of the hydrogen atoms have been substituted with halogen atoms, whereas a completely halogenated aryl group is an aryl group in which all of the hydrogen atoms have been substituted with halogen atoms.

As the group $R^{21}$, an alkyl group of 1 to 4 carbon atoms containing no substituent groups, or a fluoroalkyl group of 1 to 4 carbon atoms is the most desirable.

The organic group of $R^{22}$ is preferably a straight-chain, branched or cyclic alkyl group, an aryl group, or a cyano group. Examples of suitable alkyl groups and aryl groups for $R^{22}$ include the same alkyl groups and aryl groups described above in relation to $R^{21}$.

As the group $R^{22}$, a cyano group, an alkyl group of 1 to 8 carbon atoms containing no substituent groups, or a fluoroalkyl group of 1 to 8 carbon atoms is the most desirable.

Particularly preferred oxime sulfonate-based acid generators include the compounds represented by the general formulas (B-2) and (B-3) shown below.

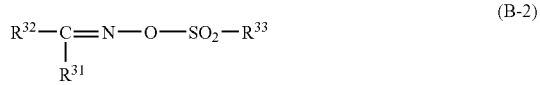

(B-2)

[In the formula (B-2), $R^{31}$ represents a cyano group, an alkyl group containing no substituent groups, or a haloalkyl group. $R^{32}$ represents an aryl group. $R^{33}$ represents an alkyl group containing no substituent groups, or a haloalkyl group.]

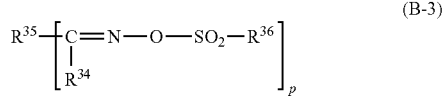

(B-3)

[In the formula (B-3), $R^{34}$ represents a cyano group, an alkyl group containing no substituent groups, or a haloalkyl group. $R^{35}$ represents a bivalent or trivalent aromatic hydrocarbon group. $R^{36}$ represents an alkyl group containing no substituent groups, or a haloalkyl group. p is either 2 or 3.]

In the above general formula (B-2), the alkyl group containing no substituent groups or haloalkyl group represented by $R^{31}$ preferably contains from 1 to 10 carbon atoms, even more preferably from 1 to 8 carbon atoms, and most preferably from 1 to 6 carbon atoms.

The group $R^{31}$ is preferably a haloalkyl group, and even more preferably a fluoroalkyl group.

In the fluoroalkyl group of $R^{31}$, at least 50% of the hydrogen atoms of the alkyl group are preferably fluorinated, and this ratio is even more preferably 70% or higher, and is most preferably 90% or higher.

The aryl group represented by $R^{32}$ is preferably a group in which one hydrogen atom has been removed from an aromatic hydrocarbon ring, such as a phenyl group, biphenyl group, fluorenyl group, naphthyl group, anthryl (anthracyl) group or phenanthryl group, or a heteroaryl group in which a portion of the carbon atoms that constitute the ring structure within the above groups have been substituted with a hetero atom such as an oxygen atom, sulfur atom or nitrogen atom. Of these possibilities, a fluorenyl group is particularly preferred.

The aryl group of $R^{32}$ may include a substituent group such as an alkyl group, haloalkyl group or alkoxy group of 1 to 10 carbon atoms. The alkyl group or haloalkyl group substituent groups preferably contain from 1 to 8 carbon atoms, and even more preferably 1 to 4 carbon atoms. Furthermore, the haloalkyl group is preferably a fluoroalkyl group.

The alkyl group containing no substituent groups or haloalkyl group represented by $R^{33}$ preferably contains from 1 to 10 carbon atoms, even more preferably from 1 to 8 carbon atoms, and most preferably from 1 to 6 carbon atoms.

The group $R^{33}$ is preferably a haloalkyl group, even more preferably a fluoroalkyl group, and is most preferably a partially fluorinated alkyl group.

In the fluoroalkyl group of $R^{33}$, at least 50% of the hydrogen atoms of the alkyl group are preferably fluorinated, and groups in which 70% or more, and even more preferably 90% or more, of the hydrogen atoms are fluorinated are particularly desirable as they increase the strength of the acid that is generated. Completely fluorinated alkyl groups in which 100% of the hydrogen atom have been substituted with fluorine atoms are the most desirable.

In the above general formula (B-3), examples of the alkyl group containing no substituent groups or haloalkyl group represented by $R^{34}$ include the same alkyl groups containing no substituent groups and haloalkyl groups described above for the group $R^{31}$.

Examples of the bivalent or trivalent aromatic hydrocarbon group represented by $R^{35}$ include groups in which a further one or two hydrogen atoms respectively are removed from an aryl group of the aforementioned group $R^{32}$.

Examples of the alkyl group containing no substituent groups or haloalkyl group represented by $R^{36}$ include the same alkyl groups containing no substituent groups and haloalkyl groups described above for the group $R^{33}$.

p is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Furthermore, further examples include the compounds represented by the chemical formulas shown below.

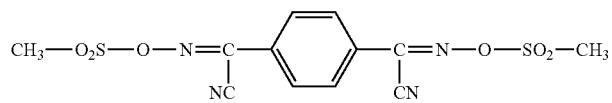

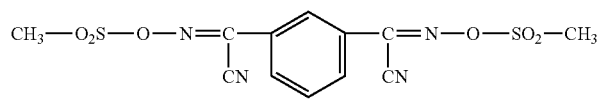

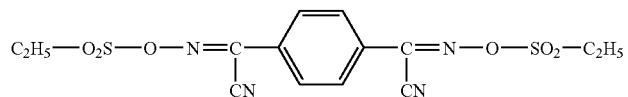

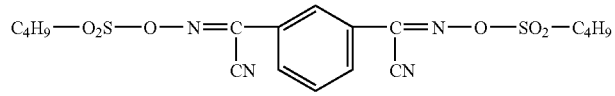

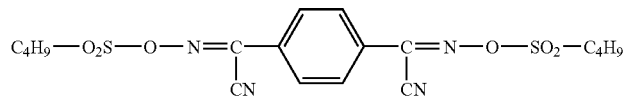

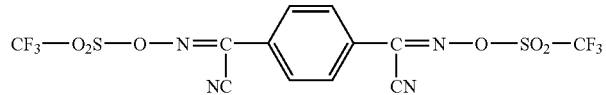

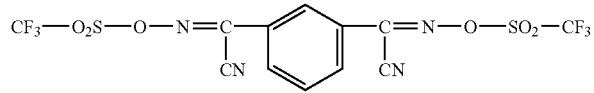

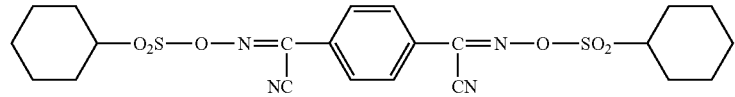

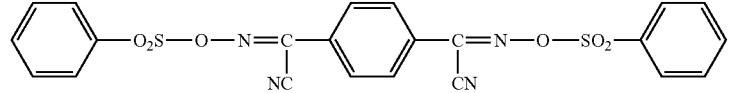

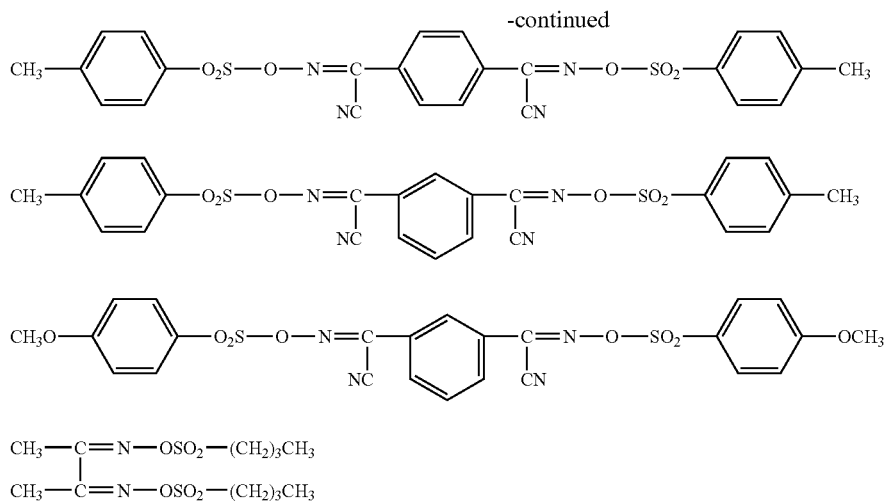
Furthermore, of the compounds represented by the aforementioned general formulas (B-2) and (B-3), examples of particularly preferred compounds include those shown below.
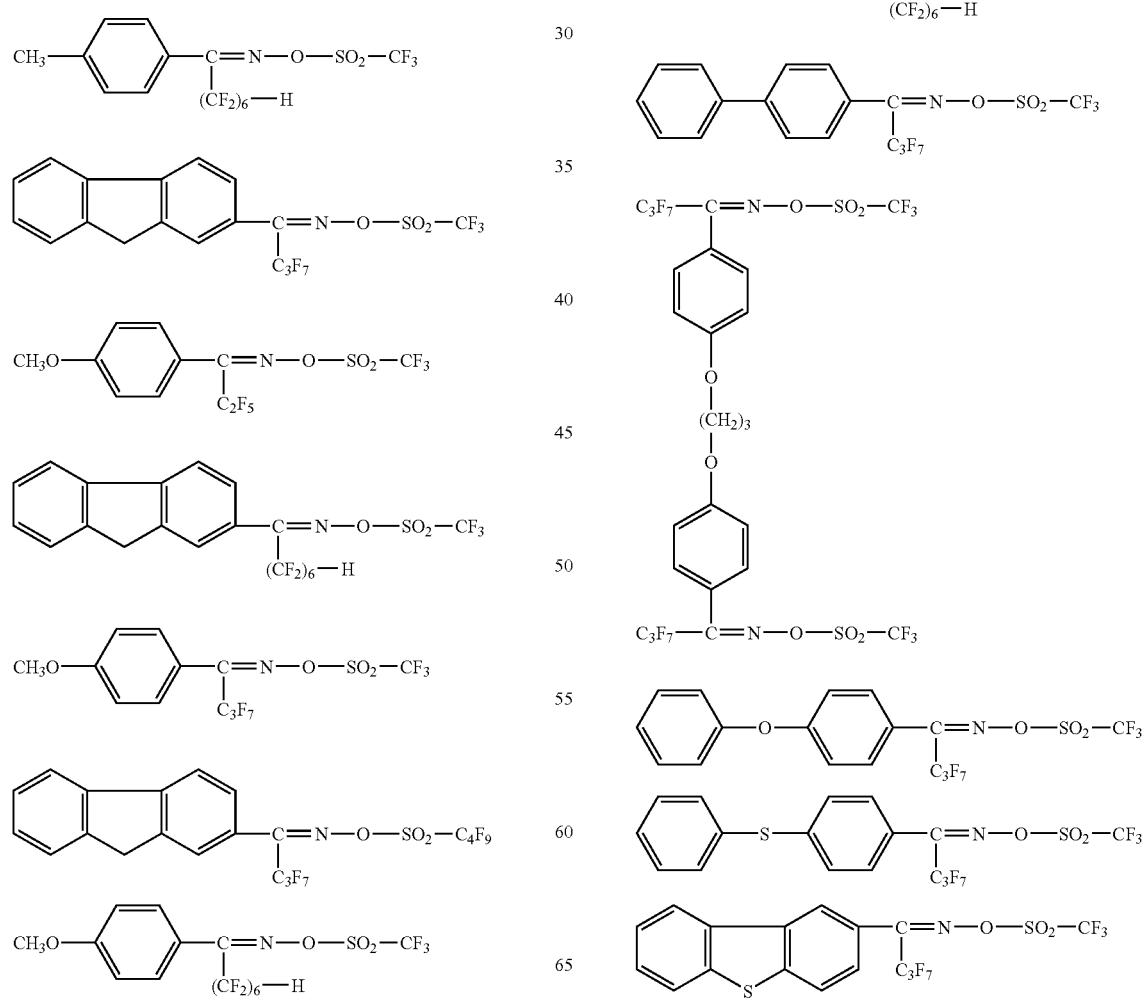

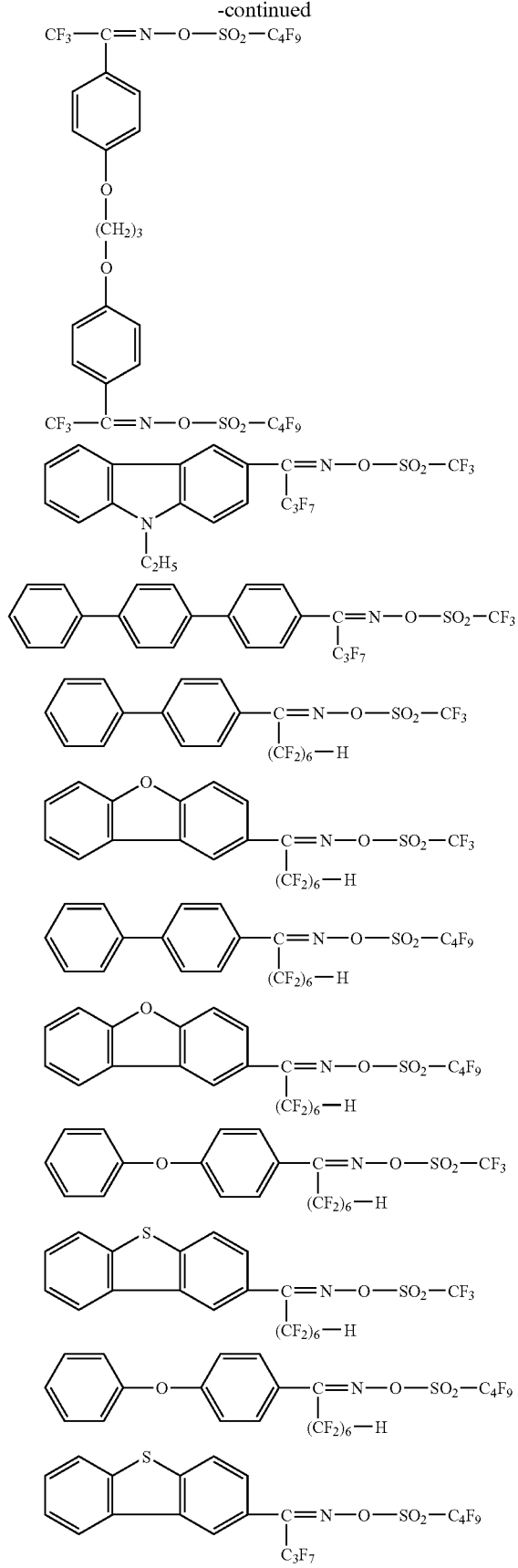
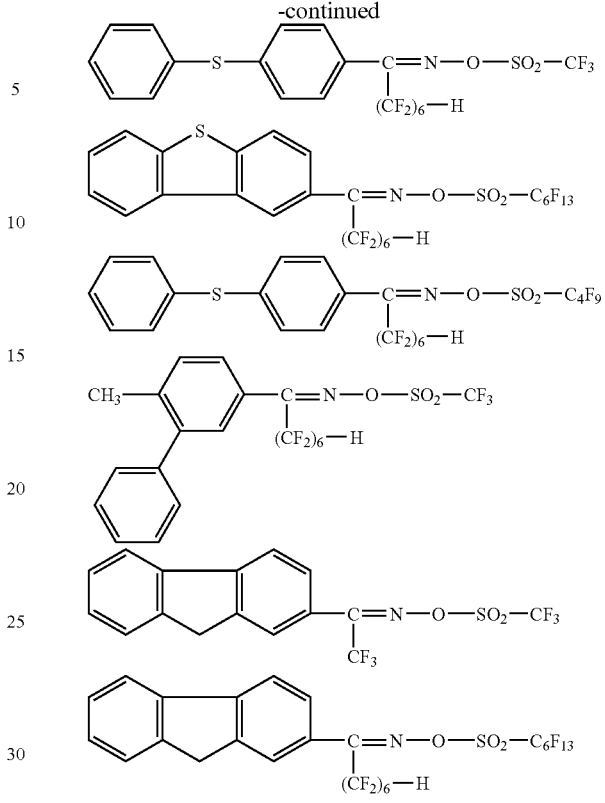

Of the above compounds, the three compounds shown below are particularly desirable.

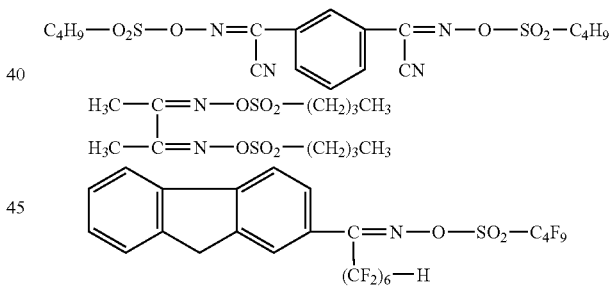

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (wherein A=3), 1,4-bis(phenylsulfonyldiazomethylsulfonyl)butane (wherein A=4), 1,6-bis(phenylsulfonyldiazomethylsulfonyl)hexane (wherein A=6), 1,10-bis(phenylsulfonyldiazomethylsulfonyl)decane (wherein A=10), 1,2-bis(cyclohexylsulfonyldiazomethylsulfonyl)ethane (wherein B=2), 1,3-bis(cyclohexylsulfonyldiazomethylsulfonyl)propane (wherein B=3), 1,6-bis(cyclohexylsulfonyldiazomethylsulfonyl)hexane (wherein B=6), and 1,10-bis(cyclohexylsulfonyldiazomethylsulfonyl)decane (wherein B=10).

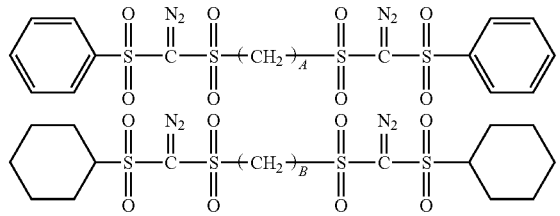

In the present invention, the use of onium salt-based acid generators as the component (B) is preferred, and compounds represented by the above general formula (b-1) in which the $R^{4''}$ group is a fluoroalkyl group, and compounds in which the anion portion of such compounds has been substituted with an anion portion represented by the general formula (b-3) are particularly desirable.

As the component (B), either a single acid generator may be used alone, or a combination of two or more of these acid generators may be used.

The quantity of the component (B) within the positive resist composition of the present invention is typically within a range from 0.5 to 30 parts by weight, and is preferably from 1 to 10 parts by weight, per 100 parts by weight of the component (A). Ensuring the quantity satisfies this range enables satisfactory pattern formation to be achieved. Furthermore, a uniform solution is obtained, and the storage stability is also favorable, both of which are desirable.

<Other Optional Components>

In the positive resist composition of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these nitrogen-containing organic compounds have already been proposed, and any of these known compounds can be used, although an aliphatic amine, and particularly a secondary aliphatic amine or tertiary lower aliphatic amine is preferred.

Examples of these aliphatic amines include amines in which at least one hydrogen atom of ammonia $NH_3$ has been substituted with an alkyl group or hydroxyalkyl group of no more than 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Of these, alkyl alcohol amines and trialkyl amines are preferred, and alkyl alcohol amines are the most desirable. Amongst the various alkyl alcohol amines, triethanolamine and triisopropanolamine are the most preferred.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition of the present invention as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Other miscible additives can also be added to the positive resist composition of the present invention according to need, and examples include additive resins for improving the performance of the resist film, surfactants for improving the coating properties, dissolution inhibitors, plasticizers, stabilizers, colorants, halation prevention agents, and dyes and the like.

<Organic Solvent>

The positive resist composition of the present invention can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Specific examples of the solvent include lactones such as γ-butyrolactone, ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, the monomethyl ether, monoethyl ether, monopropyl ether, monobutyl ether or monophenyl ether of dipropylene glycol monoacetate, or propylene glycol monomethyl ether acetate (PGMEA), cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the weight ratio PGMEA:EL is preferably within a range from 1:9 to 9:1, and is even more preferably from 2:8 to 8:2.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should be set in accordance with the coating film thickness required, at a concentration that enables favorable application of the solution to a substrate or the like, and typically the quantity of solvent is set so that the solid fraction concentration of the resist composition falls within a range from 2 to 20% by weight, and preferably from 5 to 15% by weight.

As described above, by using the positive resist composition of the present invention, a resist pattern with excellent lithography characteristics and a reduced level of defects can be formed.

Of the various lithography characteristics, a positive resist composition of the present invention exhibits a particularly superior depth of focus (DOF) and mask error factor (MEF). The MEF is a parameter that indicates how faithfully mask patterns of differing dimensions (line width or hole diameter) can be reproduced using the same exposure dose, and is determined using the formula shown below. The MEF is preferably as close as possible to 1.

$$MEF = |CDx - CDy| / |MDx - MDy|$$

In this formula, MDx and MDy represent the sizes (nm) of two different mask patterns, and CDx and CDy represent the respective sizes (nm) of the resist patterns formed using each of the mask patterns.

The reason that a reduction in the level of defects is obtained is thought to be due to the inclusion of the copolymer (A1) containing the three specific structural units. Namely, it is thought that by including the copolymer (A1), the surface of the resist film is readily wet by aqueous liquids (has a high level of hydrophilicity), and as a result, the affinity is reduced with comparatively hydrophobic solid components that can cause defects (including those components that re-precipitate during rinsing), such as deposits that contain resin components and residual substances that are left undissolved by the developing solution, meaning these deposits and residual substances can be readily removed from the resist film surface during the alkali developing and rinsing steps, thereby leading to a reduction in the level of defects.

However, the lithography characteristics are poor when only the copolymer (A1) is used, and it is thought that by mixing the copolymer (A1) with the copolymer (A2) that exhibits lower hydrophilicity than the copolymer (A1), a type of synergistic effect is obtained that results in an improvement in the lithography characteristics.

<<Method for Resist Pattern Formation>>

A method for resist pattern formation according to the present invention can be conducted using the positive resist composition of the present invention described above, for example, using the general method described below. Namely, the positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultra violet), VUV (vacuum ultra violet), EB (electron beam), X-ray or soft X-ray radiation can be used. The positive resist composition according to the present invention is particularly effective for use with an ArF excimer laser.

<Application to Shrink Process>

The positive resist composition of the present invention can be used favorably within a shrink process detailed below. In other words, even when applied to a shrink process, the composition is able to yield favorable lithography characteristics.

The applicants of the present invention have previously proposed a shrink process that includes the steps of forming a resist pattern on top of a support, forming a water-soluble coating on top of the resist pattern, and then shrinking this water-soluble coating by heat treatment and using the heat shrinkage effect to narrow the resist pattern size (for example, see Japanese Unexamined Patent Application, First Publication No. 2003-107752 and Japanese Unexamined Patent Application, First Publication No. 2003-202679).

The shrink process is a method in which, following the covering of a resist pattern with a water-soluble coating, this water-soluble coating is shrunk by heat treatment, and the resulting heat shrinkage action is used to narrow the spacing of the resist pattern.

A method for forming a resist pattern that includes the conducting of a shrink process can be conducted, for example, in the manner described below.

First, a resist pattern is formed using the general type of method described above.

Subsequently, following developing of the resist pattern, a shrink process is conducted to narrow the resist pattern size.

In the shrink process, first, a water-soluble coating formation agent containing a water-soluble polymer or the like is applied to the surface of the resist pattern formed on the support, preferably forming a laminate in which the water-soluble coating covers the entire surface of the resist pattern.

Following application of the water-soluble coating formation agent, the support may be subjected to a prebake at a temperature of 80 to 100° C. for a period of 30 to 90 seconds.

The application of the water-soluble coating formation agent can be conducted using a known method used in the formation of conventional resist layers (resist films) and the like. In other words, an aqueous solution of the coating formation agent can be applied to the resist pattern using a spinner or the like.

The thickness of the water-soluble coating is preferably either similar to the height of the photoresist pattern, or of a height sufficient to cover the pattern, and is typically within a range from approximately 0.1 to 0.5 µm.

Subsequently, the thus obtained laminate is subjected to heat treatment, causing the water-soluble coating to undergo heat shrinkage. As a result of this heat shrinkage action on the water-soluble coating, the side walls of the resist pattern that contact the water-soluble coating are pulled together, thereby narrowing the spacing (between patterns) of the resist-free portions within the resist pattern. As a result, the pattern can be reduced in size.

In the shrink process, the heat treatment is conducted at a temperature that is sufficient to cause shrinkage of the water-soluble coating, and is conducted at a heating temperature and for a heating period that does not cause fluidization of the resist.

The heating temperature is preferably set to a value that is from 3 to 50° C. lower, and even more preferably approximately 5 to 30° C. lower, than the temperature at which heat treatment starts to causes spontaneous flow of the resist pattern formed on the support (the fluidization temperature). Moreover, if the shrinking performance of the water-soluble coating is also taken into consideration, then a preferred heat treatment is typically conducted within a temperature range from 80 to 160° C., and preferably from 130 to 160° C. In the positive resist composition of the first aspect, the pattern is able to be narrowed even when the heating temperature is set to a comparatively low temperature. Favorable temperature conditions are typically within a range from 70 to 150° C.

The fluidization temperature of a resist pattern varies depending on the nature and blend quantities of the components contained within the resist composition.

The heating time varies depending on the heating temperature, but is typically within a range from 30 to 90 seconds.

Subsequently, the water-soluble coating remaining on the resist pattern is removed by washing with an aqueous solvent, and preferably with pure water, for 10 to 60 seconds. The water-soluble coating is easily removed by washing with water, and is able to be completely removed from the support and the resist pattern.

As follows is a description of a water-soluble coating formation agent that is suitable for the above shrink process.

The water-soluble coating formation agent contains a water-soluble polymer A water-soluble coating formation agent containing this type of water-soluble polymer is ideal for use within the shrink process.

From an industrial viewpoint, the water-soluble polymer used is preferably selected from amongst acrylic-based polymers, vinyl-based polymers, cellulose-based derivatives, alkylene glycol-based polymers, urea-based polymers, melamine-based polymers, epoxy-based polymers and amide-based polymers.

Acrylic-based polymers refer to polymers that contain an acrylic-based monomer, vinyl-based polymers refer to polymers that contain a vinyl-based monomer, cellulose-based polymers refer to polymers that contain a cellulose-based monomer, alkylene glycol-based polymers refer to polymers that contain an alkylene glycol-based monomer, urea-based polymers refer to polymers that contain a urea-based monomer, melamine-based polymers refer to polymers that contain a melamine-based monomer, epoxy-based polymers refer to polymers that contain an epoxy-based monomer, and amide-based polymers refer to polymers that contain an amide-based monomer.

These polymers can be used either alone, or in mixtures of two or more different polymers.

Specific examples of suitable acrylic-based polymers include polymers or copolymers containing structural units derived from monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl-based polymers include polymers or copolymers containing structural units derived from monomers such as morpholine, N-vinylpyrrolidone, vinylimidazolidinone, and vinyl acetate.

Specific examples of suitable cellulose-based derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol-based polymers include addition polymers or addition copolymers of monomers such as ethylene glycol or propylene glycol.

Specific examples of suitable urea-based polymers include polymers containing structural units derived from monomers such as methylolated urea, dimethylolated urea, and ethylene urea.

Specific examples of suitable melamine-based polymers include polymers containing structural units derived from monomers such as methoxymethylated melamine, methoxymethylated isobutoxymethylated melamine, and methoxyethylated melamine.

In addition, water-soluble polymers amongst epoxy-based polymers and nylon-based polymers (polyamide-based polymers) and the like can also be used.

Of the above water-soluble polymers, those containing at least one polymer selected from the group consisting of alkylene glycol-based polymers, cellulose-based polymers, vinyl-based polymers and acrylic-based polymers is preferred, and acrylic-based polymers are the most preferred as they also offer simple pH adjustment. In addition, using a copolymer of an acrylic-based monomer and another non-acrylic monomer is preferred, as such copolymers enable efficient narrowing of the photoresist pattern size, while maintaining the shape of the photoresist pattern during the heat treatment.

Water-soluble polymers that include N-vinylpyrrolidone as a proton donor monomer and acrylic acid as a proton acceptor monomer are particularly preferred as they exhibit a particularly large shrinkage ratio on heating. In other words, the water-soluble polymer preferably contains structural units derived from acrylic acid and structural units derived from vinylpyrrolidone.

In those cases where a copolymer is used as the water-soluble polymer, there are no particular restrictions on the relative blend proportions of the structural components, although in the case of a mixture, if long term stability is considered particularly important, then the blend proportion of the acrylic-based polymer is preferably greater than that of the other structural polymers. In order to improve the long term stability, besides increasing the proportion of the acrylic-based polymer as described above, an acidic compound such as p-toluenesulfonic acid or dodecylbenzenesulfonic acid can also be added.

The water-soluble coating formation agent preferably also contains a surfactant. By using a surfactant, the occurrence of defects can be effectively prevented.

Furthermore, from the viewpoints of preventing impurities and enabling favorable pH adjustment, the water-soluble coating formation agent may also contain an optional water-soluble amine.

Moreover, from the viewpoints of reducing the photoresist pattern size and suppressing the occurrence of defects, an additional non-amine-based water-soluble organic solvent may also be added to the water-soluble coating formation agent if desired.

The water-soluble coating formation agent is preferably used in the form of an aqueous solution with a concentration of 3 to 50% by weight, or a solution (with a concentration of 3 to 50% by weight) within a water-alcohol-based solvent (in which the alcohol concentration is no higher than approximately 30% by weight relative to the water), and is even more preferably a solution with a concentration within a range from 5 to 20% by weight.

EXAMPLES

As follows is a description of examples of the present invention, although the scope of the present invention is in no way limited by these examples.

Examples 1 to 3, Comparative Examples 1 and 2

Using the formulations and blend quantities shown in Table 1, positive resist composition solutions were prepared by dissolving a component (A), a component (B) and a component (D) in an organic solvent.

The abbreviations used in Table 1 have the meanings shown below. Furthermore, the numerical values shown within the parentheses ( ) represent blend quantities (parts by weight).

Resins 1 and 2: The structural formulas of the resins are shown below. In the formulas shown, the numerical values shown at the bottom right of the parentheses ( ) represent the proportions (molar proportions) of each of the structural units.

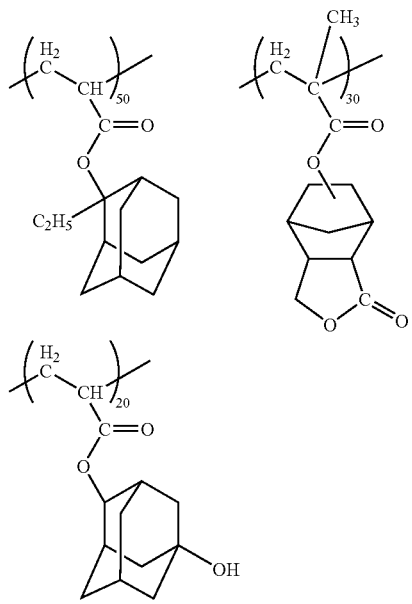

Resin 1 [Mw=7,000, Mw/Mn=2.0]

Mw represents the weight average molecular weight, Mn represents the number average molecular weight, and Mw/Mn represents the polydispersity.

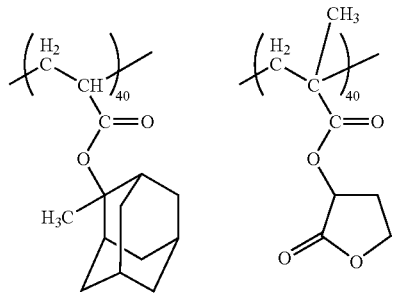

TABLE 1

|  | Component (A) | | Component (B) | | Component (D) | Organic solvent |
| --- | --- | --- | --- | --- | --- | --- |
| Example 1 | Resin 1 (30) | Resin 2 (70) | PAG 1 (2.5) | PAG 2 (1.5) | Amine 1 (0.2) | Solvent 1 (1150) |
| Example 2 | Resin 1 (40) | Resin 2 (60) | PAG 1 (2.5) | PAG 2 (1.5) | Amine 1 (0.2) | Solvent 1 (1150) |
| Example 3 | Resin 1 (50) | Resin 2 (50) | PAG 1 (2.5) | PAG 2 (1.5) | Amine 1 (0.2) | Solvent 1 (1150) |
| Comparative example 1 | Resin 1 (100) | — | PAG 1 (2.5) | PAG 2 (1.5) | Amine 1 (0.2) | Solvent 1 (1150) |
| Comparative example 2 | — | Resin 2 (100) | PAG 1 (2.5) | PAG 2 (1.5) | Amine 1 (0.2) | Solvent 1 (1150) |

-continued

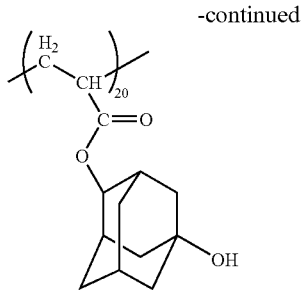

Resin 2 [Mw=7,000, Mw/Mn=2.0]

PAG 1: The structural formula of the compound is shown below.

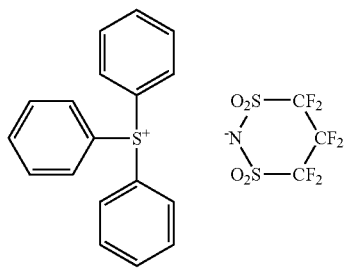

PAG 2: triphenylsulfonium heptafluoropropanesulfonate

Amine 1: triethanolamine

Solvent 1: A mixed solvent in which PGMEA/EL=8/2 (weight ratio)

(Evaluations)

Using the prepared positive resist composition solutions, the evaluations described below were conducted.

Contact Angle for the Resins 1 and 2

1 ml samples of the positive resist composition solutions from the comparative examples 1 and 2 were spin coated at a rate of revolution of 1,500 rpm onto the surface of separate silicon substrates having a diameter of 6 inches, and were then heated for 90 seconds at a temperature of 90° C., thereby forming resist films.

Subsequently, using a developing apparatus [product name: TD6133U (manufactured by Tazmo Co., Ltd.)], a 2.38% by weight aqueous solution of tetramethylammonium hydroxide (the alkali developing solution) was dripped onto the surface of each resist film at a temperature of 23° C. for a period of 30 seconds, and the resist films were then spun dry for 20 seconds at a revolution rate of 1,500 rpm.

Using a FACE contact angle meter CA-X150 (a product name, manufactured by Kyowa Interface Science Co., Ltd.), the injector fitted to the apparatus was brought into contact with each of the dried resist films (on contact between the injector and the resist film, 2 μL of pure water was released onto the resist film surface), and the contact angle was measured, and the results revealed a contact angle of 55.8° for the resin 1 (the positive resist composition of the comparative example 1), and a contact angle of 37.8° for the resin 2 (the positive resist composition of the comparative example 2).

The results are shown in Table 2.

Evaluation of Depth of Focus (DOF)

An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm. The positive resist composition solution was then applied to the surface of this anti-reflective film using a spinner, and was then prebaked (PAB) and dried on a hotplate for 90 seconds at the PAB temperature shown in Table 2, thereby forming a resist film with a film thickness of 220 nm.

Subsequently, this film was selectively irradiated with an ArF excimer laser (193 nm) through a (6% half-tone) mask pattern, using an ArF exposure apparatus NSR-S306 (manufactured by Nikon Corporation; NA (numerical aperture)= 0.78, ½ annular illumination).

The resist was then subjected to PEB (post-exposure baking) treatment for 90 seconds at the PEB temperature shown in Table 2, was subsequently subjected to puddle development for 60 seconds at 23° C. in a 2.38% by weight aqueous solution of tetramethylammonium hydroxide, and was then washed for 20 seconds with water and dried, thus forming an isolated hole pattern with a hole diameter of 100 nm.

Using the optimum exposure EOP (mJ/cm$^2$) for forming an isolated hole pattern with a hole diameter of 100 nm, the focal point was appropriately offset up or down, and the depth of focus (DOF) range (μm) across which an isolated hole pattern could be formed with a dimensional variation within ±10% of the specified 100 nm diameter was determined. The results are shown in Table 2.

Evaluation of the Mask Error Factor (MEF)

Using the above EOP, but with the exception of altering the size of the mask pattern to 145 nm or 135 nm, the same procedure as above was used to form isolated hole patterns with hole diameters of 145 nm and 135 nm respectively, and the MEF (mask error factor) was then calculated using the formula shown below.

$$MEF=|CD145-CD135|/|MD145-MD135|$$

In the above formula, CD145 and CD135 represent the dimensions (diameter (nm)) of the hole patterns formed using the mask patterns of 145 nm and 135 nm respectively, and MD145 and MD135 represent the hole diameters (nm) of those two mask patterns, so that MD145=145 and MD135=135. The MEF is a parameter that indicates how faithfully mask patterns of differing dimensions can be reproduced using the same exposure dose, and MEF values that are closer to 1 indicate more favorable mask linearity. The results are shown in Table 2.

Evaluation of Defects

Using a spinner, each positive resist composition solution was applied directly to the surface of an 8-inch silicon wafer that had been treated with hexamethyldisilazane (HMDS), and the solution was then prebaked (PAB) and dried on a hotplate for 90 seconds at the PAB temperature shown in Table 2, thereby forming a resist film with a film thickness of 220 nm.

Subsequently, the resist film was selectively irradiated with an ArF excimer laser (193 nm) through a (binary) mask pattern, using an ArF exposure apparatus NSR-S306 (manufactured by Nikon Corporation; NA (numerical aperture)=0.78, σ=0.30).

The resist was then subjected to PEB treatment for 90 seconds at the PEB temperature shown in Table 2, and subsequently subjected to puddle development for 60 seconds at 23° C. in a 2.38% by weight aqueous solution of tetramethylammonium hydroxide, and a rinse liquid was then dripped onto the resist for 1 second at 1,000 rpm and then for 15 seconds at 500 rpm (enforced conditions for increasing the likelihood of defect occurrence), before the resist was dried to form a resist pattern.

Furthermore, the pattern was formed as a dense hole pattern with a hole diameter of 300 nm (a pattern in which holes of diameter 300 nm were spaced at 300 nm intervals).

Subsequently, the resist was measured using a surface defect inspection device KLA2351 (a product name) manufactured by KLA Tencor Corporation, and the number of defects within the wafer was evaluated. The results are shown in Table 2.

TABLE 2

| | PAB temperature | PEB temperature | Contact angle | DOF | MEF | Defects |
|---|---|---|---|---|---|---|
| Example 1 | 110° C. | 95° C. | — | 0.20 μm | 5.4 | 5,000 |
| Example 2 | 110° C. | 95° C. | — | 0.25 μm | 5.4 | 6,500 |
| Example 3 | 110° C. | 95° C. | — | 0.25 μm | 5.14 | 8,000 |
| Comparative example 1 | 110° C. | 90° C. | 55.8° | 0.20 μm | 6.07 | 16,000 |
| Comparative example 2 | 110° C. | 100° C. | 37.8° | 0.15 μm | 12.8 | 400 |

As shown above, in the examples 1 through 3, which used a mixture of the resin 2 that corresponds with the copolymer (A1), and the resin 1 (that corresponds with the copolymer (A2)) which has a larger contact angle and a lower hydrophilicity than the resin 2, the DOF was at least the same or better than that of the comparative examples, and the MEF was closer to 1 than either of the comparative examples, with the MEF being particularly favorable for the example 3 in which the resin 1 and the resin 2 were mixed together in a ratio of 1:1. From these results it is clear that the examples 1 through 3 exhibit superior mask linearity. Furthermore, the level of defects was also reduced to less than half of the level observed for the comparative example 1.

In contrast, in the comparative example 1 that used only the resin 1, although the DOF was similar to that of the example 1, the MEF and the level of defects were significantly inferior. Furthermore, in the comparative example 2 that used only the resin 2, although the level of defects was low, both the DOF and MEF were poor.

INDUSTRIAL APPLICABILITY

A positive resist composition and a method for resist pattern formation are provided that are capable of forming resist patterns with excellent lithography characteristics and reduced levels of defects.

The invention claimed is:

1. A positive resist composition, comprising:
   a resin component (A) that exhibits increased alkali solubility under action of acid; and
   an acid generator component (B) that generates acid upon exposure, wherein
   said resin component (A) is a mixture of a copolymer (A1) that includes a structural unit (a1) derived from an acrylate ester that contains an acid-dissociable, dissolution-inhibiting group, a structural unit (a2) derived from a methacrylate ester that contains a lactone-containing monocyclic group, and a structural unit (a3) derived from an acrylate ester that contains a polar group-containing polycyclic group, and a copolymer (A2) that has a different structure from said copolymer (A1) and has a lower hydrophilicity than said copolymer (A1).

2. A positive resist composition according to claim 1, wherein a contact angle for said copolymer (A1) is no more than 40 degrees.

3. A positive resist composition according to claim 1, wherein a contact angle for said copolymer (A2) is at least 45 degrees but no more than 60 degrees.

4. A positive resist composition according to claim 1, wherein a contact angle for said copolymer (A1) is no more than 40 degrees, and a contact angle for said copolymer (A2) is at least 45 degrees but no more than 60 degrees.

5. A positive resist composition according to claim 1, wherein said copolymer (A2) includes from 20 to 80 mol % of structural units derived from acrylate esters.

6. A positive resist composition according to claim 1, wherein said copolymer (A2) is a copolymer that includes a structural unit (a1') derived from an (α-lower alkyl)acrylate ester that contains an acid-dissociable, dissolution-inhibiting group, a structural unit (a2') derived from an α-lower alkyl) acrylate ester that contains a lactone-containing monocyclic or polycyclic group, and a structural unit (a3') derived from an α-lower alkyl)acrylate ester that contains a polar group-containing polycyclic group.

7. A positive resist composition according to claim 6, wherein said structural unit (a2') is a structural unit derived from an α-lower alkyl)acrylate ester that contains a lactone-containing polycyclic group.

8. A positive resist composition according to claim 1, wherein said copolymer (A1) includes three structural units represented by a general formula (A1-1) shown below.

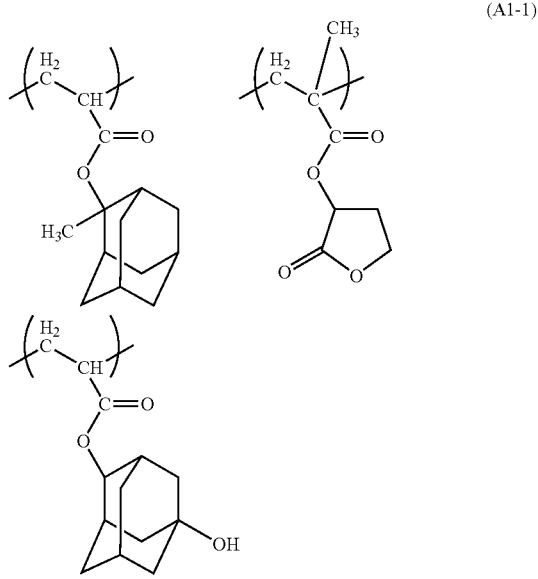

9. A positive resist composition according to claim 1, wherein said copolymer (A2) includes three structural units represented by a general formula (A2-1) shown below.

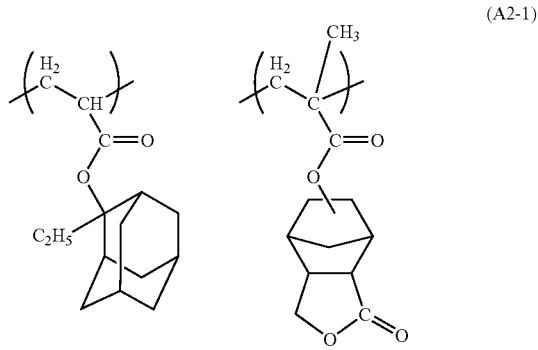

-continued

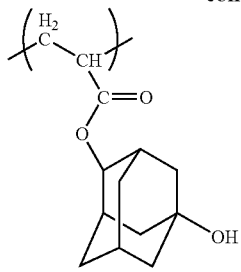

10. A positive resist composition according to claim 1, wherein within said resin component (A), a mixing ratio (weight ratio) between said copolymer (A1) and said copolymer (A2) is within a range such that copolymer (A1): copolymer (A2) 20:80 to 80:20.

11. A positive resist composition according to claim 1, further comprising a nitrogen-containing organic compound (D).

12. A method for resist pattern formation, comprising the steps of:
   forming a resist film on a substrate using a positive resist composition according to any one of claim 1 through claim 11;
   conducting exposure of said resist film; and
   developing said resist film to form a resist pattern.

* * * * *